US006421798B1

United States Patent
Lin et al.

(10) Patent No.: US 6,421,798 B1
(45) Date of Patent: Jul. 16, 2002

(54) CHIPSET-BASED MEMORY TESTING FOR HOT-PLUGGABLE MEMORY

(75) Inventors: Lixin Lin; Liming Qu, both of Dallas; Bing Zhang, Addison, all of TX (US); Toh Kay Huat, Singapore (SG)

(73) Assignee: Computer Service Technology, Inc., Dallas, TX (US)

( * ) Notice: Subject to any disclaimer, the term of this patent is extended or adjusted under 35 U.S.C. 154(b) by 0 days.

(21) Appl. No.: 09/353,704

(22) Filed: Jul. 14, 1999

(51) Int. Cl.[7] .............................................. G11C 29/00
(52) U.S. Cl. ...................................................... 714/718
(58) Field of Search ............................ 714/718; 365/201

(56) References Cited

U.S. PATENT DOCUMENTS

| 4,654,783 A | 3/1987 | Veres et al. |
| 4,959,777 A | 9/1990 | Holman, Jr. |
| 5,230,052 A | 7/1993 | Dayan et al. |
| 5,233,616 A | 8/1993 | Callander |
| 5,249,281 A | 9/1993 | Fuccio et al. |
| 5,592,616 A | * 1/1997 | Finch et al. .................... 714/42 |
| 5,978,912 A | * 11/1999 | Rakavy et al. .................. 713/2 |
| 6,178,526 B1 | * 1/2001 | Nguyen et al. ................ 714/42 |

* cited by examiner

*Primary Examiner*—Albert Decady
*Assistant Examiner*—Cynthia Harris
(74) *Attorney, Agent, or Firm*—Howison, Thoma & Arnott, L.L.P.

(57) ABSTRACT

A method of testing memory of a system is disclosed which operates the system from a second area of system address space which is outside of a first area of system address space, the system having one or more physical memory devices associated with the first area of system address space. The memory locations associated with the first area of the system address space are tested for predetermined characteristics after which the one or more tested physical memory devices are replaced with respective untested physical memory devices without dropping power to the system, and tested by repeating the test cycle. The system is prevented from operating in the first area of system address space and forced to operate from the second area, thereby preventing system interruptions when replacing the physical memory devices for testing.

26 Claims, 4 Drawing Sheets

CHIPSET-BASED MEMORY TESTING FOR HOT-PLUGGABLE MEMORY

TECHNICAL FIELD OF THE INVENTION

This invention relates in general to computer memory testing, and more particularly, a memory tester for testing memory in a motherboard-compatible environment.

BACKGROUND OF THE INVENTION

Computer memory testing is becoming more demanding given the higher operational speeds of processors, and associated memory. Therefore more effective and efficient means are needed to perform testing while minimizing downtime during a production environment. Conventional memory testing techniques in a personal computer (PC) involve cycling system power which is cumbersome and time consuming.

All computer hardware has to work with software through an interface. A computer system's basic input/output system (BIOS) is responsible for booting the computer by providing a basic set of instructions. The code stored in a BIOS chip performs the power-on self-test (POST) routine at startup, then establishes communication with floppy disks, hard disks, keyboards, ports, and expansion slots before finally handing over control to the operating system. The BIOS gives the PC a basic software starter-kit from which the central processing unit (CPU) becomes "aware" of all peripheral devices which are a part of the system. When the BIOS boots to establish basic system awareness, it provides an interface to the underlying hardware for the operating system in the form of a library of interrupt handlers. Any device requesting attention by the CPU sends a signal out on an interrupt line to an interrupt controller, which then signals the CPU that the device needs attention. The POST process also performs a basic test of the physical memory (e.g., DRAM). This is typically evidenced on a computer display during boot-up by a rapidly incrementing number indicating that each memory location of the physical memory is being checked. Upon completion of a successful check, the BIOS continues the boot-up procedure by establishing all necessary handshaking with peripheral devices.

In addition to physical memory, typically in the form of DRAM, the PC has faster memory called cache memory. Cache memory is a special high-speed memory used to accelerate processing of the most recently used memory instructions by the CPU. The CPU can access instructions and data located in cache memory much faster than instructions and data in the main DRAM memory. For example, on a typical 100-MHz system board, it takes the CPU as much as one-hundred-and-eighty nanoseconds to obtain information from physical memory, compared to just forty-five nanoseconds from the cache memory. Therefore, the more instructions and data the CPU can access directly from cache memory, the faster the computer can run. Cache memory is categorized into external secondary (L2 cache) and internal primary (L1 cache). The "brain" of a cache memory system is called the cache memory controller. When a cache memory controller retrieves an instruction from physical memory, it also takes back the next several instructions to cache memory.

This occurs because there is a high likelihood that the adjacent instructions will also be needed. This increases the chance that the CPU will find the instruction it needs in cache memory, thereby enabling the computer to run faster.

A PC consists of different functional parts installed on its motherboard: ISA (Industry Standard Architecture) and PCI (Peripheral Component Interface) slots, memory, cache memory, keyboard plug, etc. Not all of these are present on every motherboard. One or more interface circuits enable a set of instructions so the CPU can communicate with other parts of the motherboard. Most of the discrete chips: PIC (Programmable Interrupt Controller), DMA (Direct Memory Access), MMU (Memory Management Unit), cache, and so on, are packed together on one, two, or three chips which are cooperatively known as the "chipset." In some well-integrated motherboards, the only components present are the CPU, the two BIOS chips (system BIOS and keyboard BIOS), one chipset IC, cache memory, physical memory (e.g., DRAM), and a clock chip.

SUMMARY OF THE INVENTION

A method of testing memory of a system is disclosed which operates the system from a second area of system address space which is outside of a first area of system address space, the system having one or more physical memory devices associated with the first area of system address space. The memory locations associated with the first area of the system address space are tested for predetermined characteristics after which the one or more tested physical memory devices are replaced with respective untested physical memory devices without dropping power to the system, and tested by repeating the test cycle. The system is prevented from operating in the first area of system address space and forced'to operate from the second area, thereby preventing system interruptions when replacing the physical memory devices for testing.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

The disclosed architecture offers a method of testing memory in a personal computer (PC), replacing that tested memory with new untested memory, and then testing the new untested memory while the PC is operational (also called hot-pluggable testing). This architecture is particularly attractive in a production or assembly-line environment where high system throughput is desired, since PC system power does not need to be cycled each time memory modules are swapped in and out. Therefore, the PC does not need to execute a lengthy boot-up operation after each test.

Figure 1:
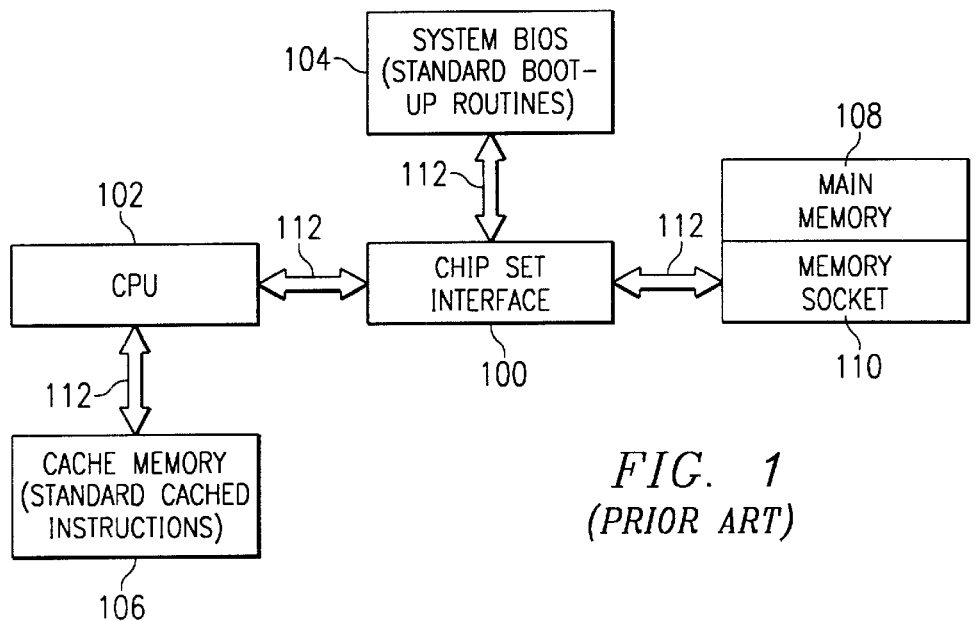
FIG. 1 illustrates a conventional PC architecture.

Referring now to FIG. 1, there is illustrated a conventional PC architecture. The PC consists of different functional parts installed on its motherboard: card slots (e.g., ISA and PCI), physical memory, cache memory, keyboard plugins, etc. Not all of these are shown or even present on every motherboard. A chipset interface 100 enables a set of instructions so that a CPU 102 can communicate with these peripheral devices of the motherboard. The bus interfaces 112 have data, address, and control lines for carrying such signals to the respective devices. On some well-integrated motherboards, essentially the only primary components present are the CPU 102, a system BIOS 104 hosting standard boot-up routines, one chipset integrated circuit 100, cache memory 106 used for caching standard instructions for the CPU 102, physical memory 108 inserted into respective physical memory slots 110, and a clock chip (not shown). As mentioned hereinabove, all computer hardware has to work with software through an interface. The system BIOS 104 is responsible for booting the computer by providing a basic set of instructions. It performs all the tasks that need to be done at start-up time. Furthermore, the system BIOS 104 provides an interface to the underlying hardware for the operating system in the form of a library of interrupt handlers. For instance, each time a key is pressed, the CPU is interrupted to read the keyboard for processing of that key. This is similar for other input/output devices such as serial ports, parallel ports, video cards, sound cards, hard disk controllers, etc.

In the conventional architecture, memory tests are performed shortly after boot-up of the system by code residing in the system BIOS 104. After the memory test is complete, normal handshaking is performed between the CPU and all on-board peripherals to ensure proper operation. The operating system then loads and takes over control of all functions of the system. Any subsequent memory testing from this point on requires shutting the system down, replacing any memory modules, and then restarting the system such that the memory test programing system BIOS 104 executes to determine if the memory is viable. This standard type of memory checking process is not suited for production-type memory testing. It requires a time-consuming prospect of cycling power of the machine, manually replacing memory modules, and bringing the power back up in order to determine the viability of the physical memory 108.

Figure 2:
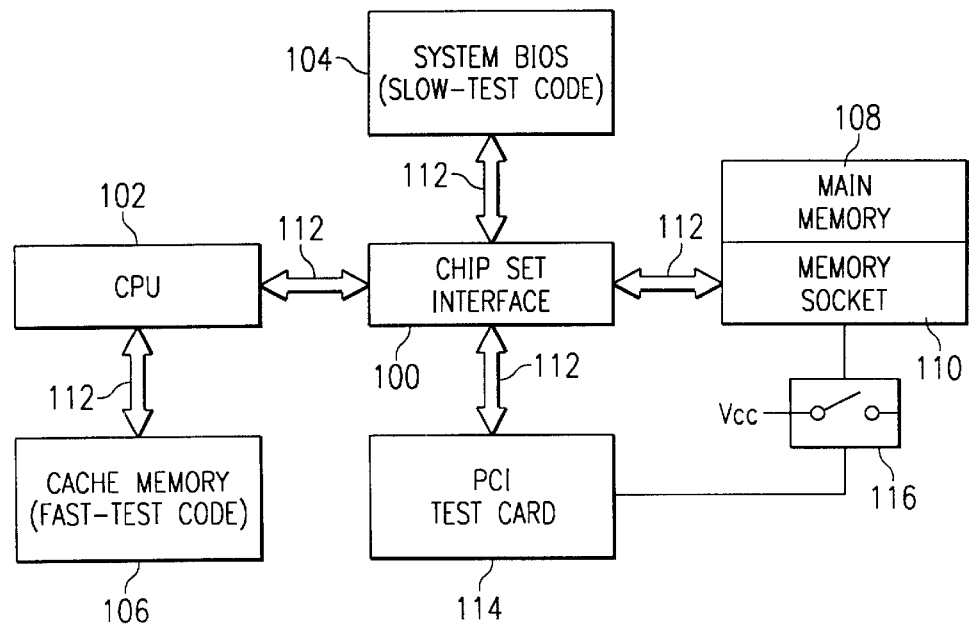
FIG. 2 illustrates a general computer memory test architecture block diagram according to a disclosed embodiment.

Referring now to FIG. 2, there is illustrated a general computer memory test architecture block diagram according to a disclosed embodiment. The disclosed architecture uses the same basic elements of the conventional memory test system of FIG. 1 with the exception of an additional PCI test card 114 controlling a memory power switch 116, and enhanced BIOS code running in part in the cache memory 106 and the system BIOS 104. Therefore implementation of the disclosed computer memory test architecture is straightforward. The system includes a chipset interface 100 for interfacing to a CPU 102, physical memory modules 108 seated in a respective physical memory sockets 110, the system BIOS 104 for providing the start-up code, and the cache memory 106 interfacing directly to the CPU 102 for fast memory access. (The cache memory 106, as depicted, may be either the internal or external cache discussed hereinabove.) The bus interfaces 112 have data, address, and control lines for carrying such signals to the respective devices. The disclosed system is distinguishable from the prior art in that the BIOS code has been modified such that after start-up, the PCI card 114 enables the memory power switch 116 to drop power only to the physical memory 108 such that it may be pulled from its memory slot 10 and replaced while the computer system is running, precluding the need to power down the system to replace the memory for testing. This is accomplished by not running the system BIOS code from the physical memory 108, but from PCI memory space using a coordinated effort of the system BIOS 104, cache memory 106, and the PCI card 114, which will be discussed in greater detail hereinbelow.

Figure 3:
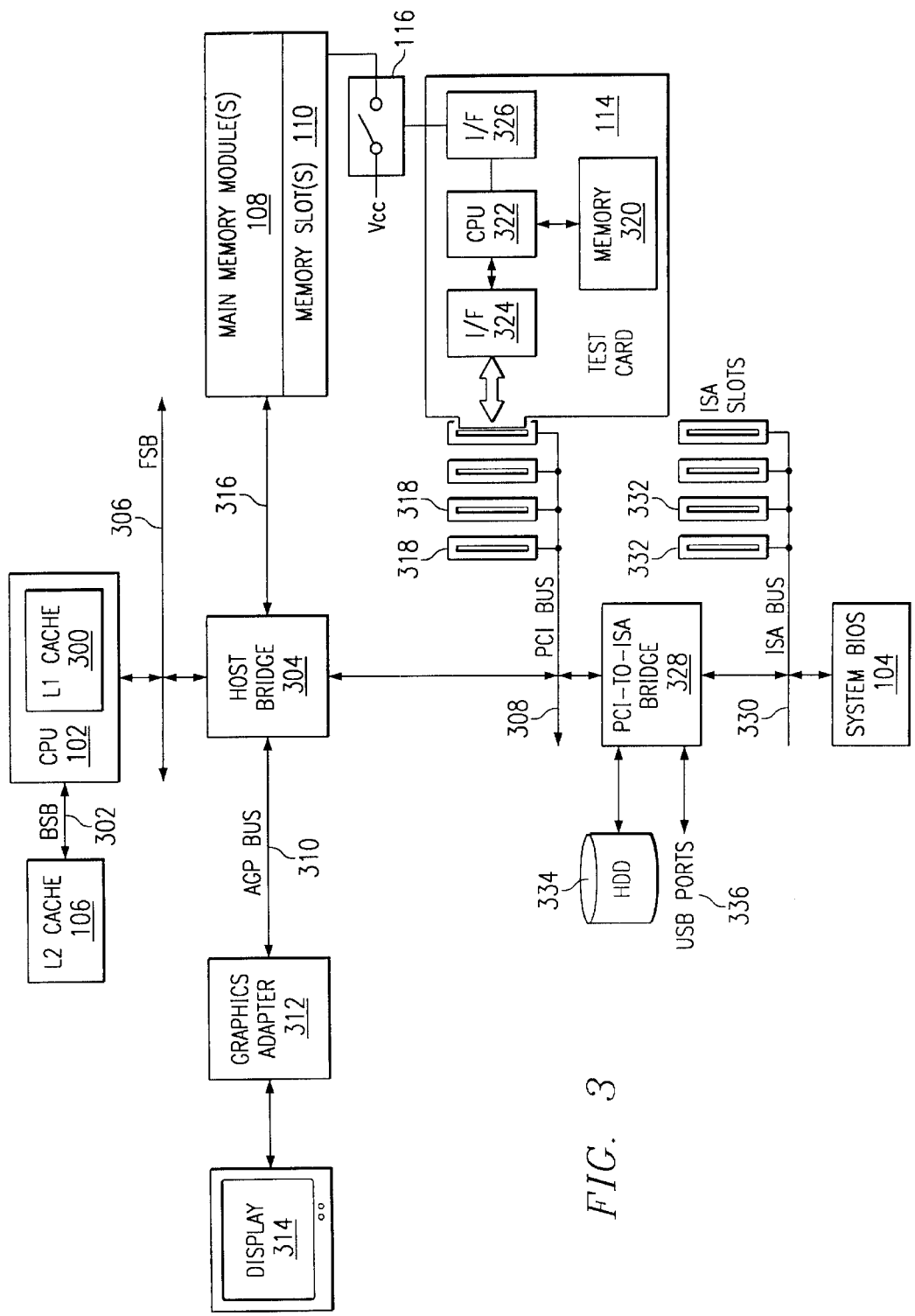
FIG. 3 illustrates a more detailed PC system block diagram according to a disclosed embodiment.

Referring now to FIG. 3, there is illustrated a more detailed PC system block diagram according to a disclosed embodiment. The host CPU 102 has access to one or more cache memories. An internal L1 cache 300 provides onboard caching of instructions, while an external L2 cache 106 provides the similar function from an external location across a high speed cache bus interface 302 (also called the backside bus or BSB). Note that, for this discussion, the cache memory 106 is shown as external L2 cache. One part of a chipset, a host bridge 304 (also a memory mapping device which provides a memory mapping function), provides bus control signals, data, and address paths for transfers between the host CPU 102 front-side bus (FSB) 306, a PCI bus 308, AGP bus 310, and physical memory modules(s) 108 seated in the memory slot(s) 110. The AGP bus 310 provides the communication interface to a graphics adapter 312 which drives a display 314 for the output and display of information to a user.

The host bridge 304 integrates a DRAM controller for interfacing with physical memory 108 over a physical memory bus 316. Power to the physical memory 108 is switched using the memory power switch 116 controlled by the PCI test card 114 in order to facilitate dropping power to the physical memory 108 prior to replacing the memory which has been tested with new untested memory. It can be appreciated that under certain conditions the physical memory 108 may also be removed without dropping power thereto.

The PCI bus 308 (also called a peripheral bus) has associated therewith several PCI slots 318 for accommodating PCI-compatible adapter cards. The PCI test card 114 (also called a peripheral test card) inserts into one of the PCI slots 318 to facilitate control of the memory power switch 116 and testing of the physical memory 108. In order to cycle the power to the physical memory 108, a physical connection is implemented to the power connections of the physical memory 108 to be able to control the power with the PCI test card 114. Alternatively, one could build an extension card with an interface so that any particular memory module slot 110 could be powered/unpowered while others are being tested. The PCI test card 114 has an onboard test card memory 320 which interfaces to an onboard test card CPU 322. The test card CPU 322 is operable to send and receive commands and data through a PCI interface circuit 324 across the PCI bus 308 to the host CPU 102. The test card CPU 322 also controls the memory power switch 116 through a power interface 326.

Another part of the chipset is the PCI-to-ISA bridge 328 which provides interface capability from the PCI bus 308 to an ISA bus 330. The ISA bus 330 is a slower bus than the PCI bus 308 and handles those "legacy" devices which use older technology and which can be inserted into one or more ISA slots 332. Also, the system BIOS 104 interfaces to the ISA bus 330 since the BIOS resides in slower nonvolatile ROM (read-only memory). architecture which is incapable of operating off of the PCI bus 308. The PCI-to-ISA bridge 328 also provides interface capabilities to one or more disk drives (e.g., a hard disk drive (HDD) 334), I/O ports (e.g., USB ports 336) and other output devices.

Figure 4:
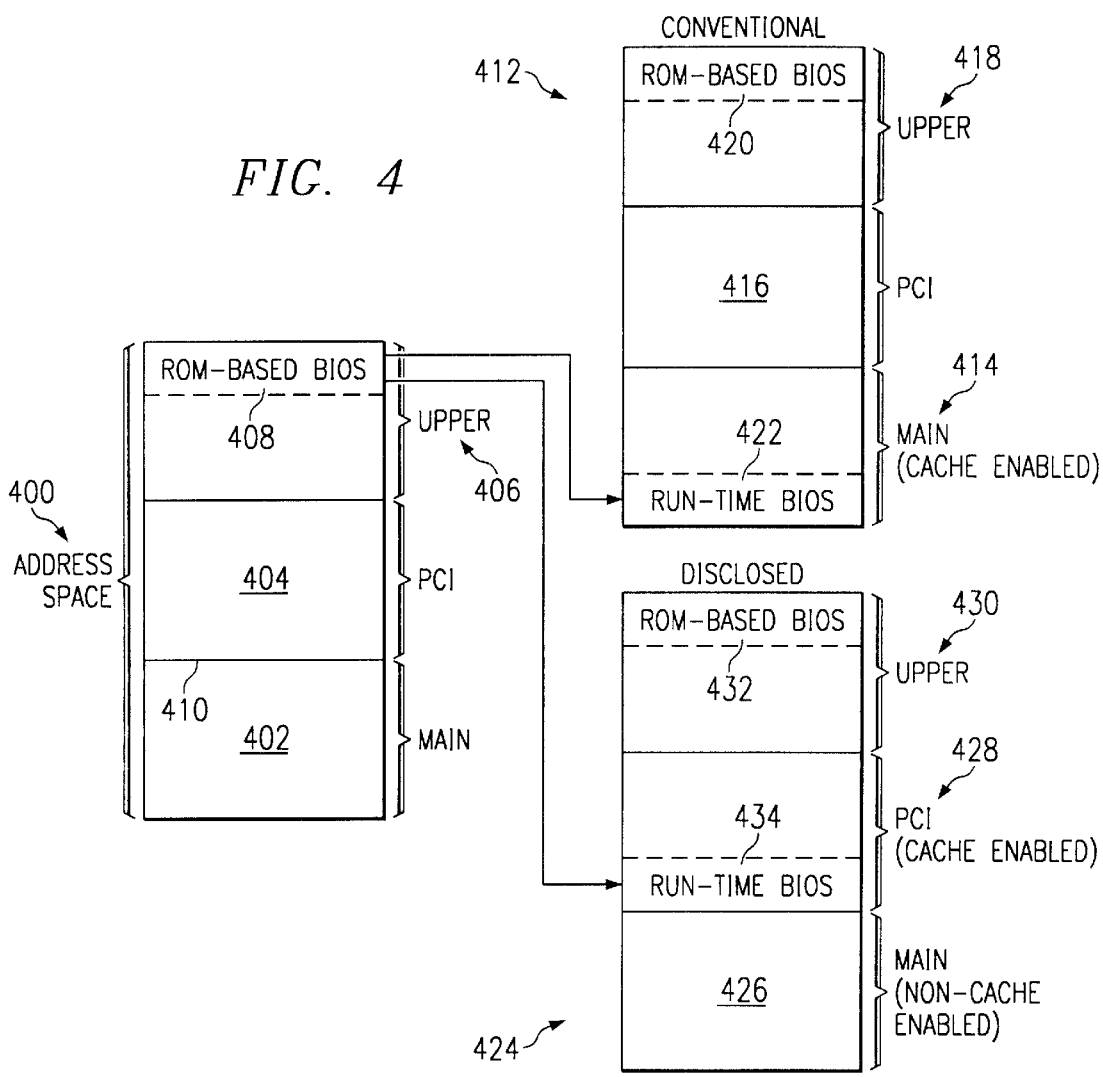
FIG. 4 illustrates a a block diagram of system address space as implemented by conventional systems and a disclosed embodiment.

Referring now to FIG. 4, there is illustrated a block diagram of system address space as implemented by conventional systems and a disclosed embodiment. The conventional boot-up process runs code directly from the BIOS flash ROM 104. In this particular embodiment, a chipset 100 is provided which can map an address from an address space 400 of a CPU to memory space having four-gigabytes of potential memory locations, this typically referred to as physical memory space. This is basically defined by the addressing capability of the CPU. It can be appreciated that the disclosed method is not restricted to a four-gigabyte physical memory space, but is applicable to any size-of physical memory space provided the chipset 100 (memory mapping device) and CPU 102 can accommodate such an addressable space.

The address space 400 is divided into several sections; a main memory address space 402 associated with a lower one-gigabyte of physical memory (in this particular embodiment), a PCI address space 404 to which PCI devices are mapped, and an upper address space 406 which encompasses the remaining portion of address space 400. The upper address space 406 has a BIOS address space 408 which is mapped to the ROM-based BIOS during operation of the system. This is programmed into the operating system. The BIOS code resides in a ROM that occupies the BIOS address space 408 (the uppermost memory locations) of address space 400. An upper barrier 410 of the address space 400 is defined by the particular chipset 100 used to divide the main memory address space 402 from the PCI address space 404.

In a conventional address space 412 having the same general structure of address space 400, there is provided a main memory address space 414, a PCI address space 416, and an upper address space 418, all similar to the respective address space areas (402, 404, and 406) of address space 400. A BIOS address space 420 (the uppermost area of conventional address space 412) located within the upper address space 418 is associated with the ROM containing the BIOS code. The ROM-based BIOS code performs a "pretest" step of the lower 512K memory locations associated with the main memory address space 414 to ensure that those locations are viable. The ROM-based BIOS code then executes to copy a run-time version of the BIOS code into memory locations associated with a run-time BIOS address space 422 of the main memory address space 414 and executes the BIOS functions using only those addresses. Execution of the run-time BIOS code from memory locations associated with main memory address space 414 is much faster than code execution from the slower ROM-based architecture of system BIOS 104.

The memory locations associated with main memory address space 414 of the conventional address space 412 are also cache-enabled for faster CPU performance. When the operating system finally boots, memory locations associated with the runtime BIOS address space 422 located within the main memory address space 414 (and where the run-time BIOS code currently resides), are protected, such that it can not be overwritten. This is important, since overwriting the BIOS code in memory locations associated with the main memory address space 414 during operation prevents the PC from operating properly. Therefore, the conventional method prohibits the swapping of physical memory 108 while the system is powered, since code is executing only from memory locations associated with the run-time BIOS address space 422, which is a part of the main memory address space 414 associated with the physical memory 108. It can also be appreciated that, since the run-time BIOS code is stored in memory locations associated with the run-time BIOS address space 422, which are also part of physical memory 108, one could only test that portion of the physical memory 108 which does not contain any code. For example, if a system has four banks of memory (Bank 0–3) each having physical memory 108, the run-time BIOS code could be executed using addresses within the address space associated with that Bank 0 (which is not replaced), while physical memory 108 located in Banks 1–3 may be tested and replaced as needed.

In a disclosed address space 424 having the same general structure of address space 400, there is provided a main memory address space 426, a PCI address space 428, and an upper address space-430, all similar to the respective address spaces 402,404, and 406 of address space 400. A BIOS address space 432 (the uppermost area of disclosed address space 424) located within the upper address space 430 is associated with the BIOS code in the ROM. Certain parts of the disclosed address space 424 are associated with memory locations that are cache-enabled, while other areas of the memory space are made non-cache-enabled. This practice facilitates the caching into cache memory 106 that high-speed portion of an enhanced BIOS code required for running test patterns on the physical memory 108. The low-speed portion of the BIOS code remains stored in memory locations associated with the ROM-based address space 432, and runs therefrom.

To enable caching of the portion of high-speed BIOS code, a loader routine in the enhanced BIOS code causes the high-speed code to be loaded into cache memory 106 by first writing it into memory locations associated with a high-speed address space 434 of PCI address space 428 (which, in this embodiment, is located above the one-gigabyte main memory address space 426). In other words, the high-speed BIOS code is stored in memory locations which are not associated with the address space of physical memory 108. The PCI address space 428 is designated as cache-enabled, and is associated with the PCI test card 114. Portions of the BIOS code are then run from memory locations associated with the PCI address space 428. Therefore, the high-speed portion of the BIOS code is loaded into cache memory 106 by reading memory locations associated with the run-time BIOS address space 434 (the normal process of caching automatically loads the BIOS run-time instructions into cache memory 106 when read). The main memory address space 426 is non-cache-enabled so that memory locations associated with it can be tested without interrupting system operation.

The memory mapping device 100 provides electrical isolation between two buses; the physical memory bus.316 and the PCI bus 308. Therefore, the PCI test card 114 on the PCI bus 308 is electrically isolated from the physical memory bus 316. Thus signal flow across the PCI bus 308 is unaffected by signal interruptions created by replacing physical memory 108 during testing. Correspondingly, memory locations associated with PCI address space 428 are isolated from the memory locations associated from the main memory address space 414.

The enhanced BIOS code is self-contained in that no outside calls are made to code which runs external to the enhanced BIOS code, but only internal calls to various portions of the enhanced BIOS code, itself. This feature allows for running a portion of the code from the cache memory 106 and another portion from system BIOS 104, during the testing operations. No enhanced BIOS code is run in memory locations associated with the main memory address space 426, which also comprises those memory locations associated with the physical memory 108. Thus removal of any physical memory 108 during testing will not interrupt operation of the PC system. The normal triggering routine between execution of the high-speed code and the low-speed code is the initiation and completion of pattern testing, since pattern testing is only performed from the cache memory 106.

Figure 5:
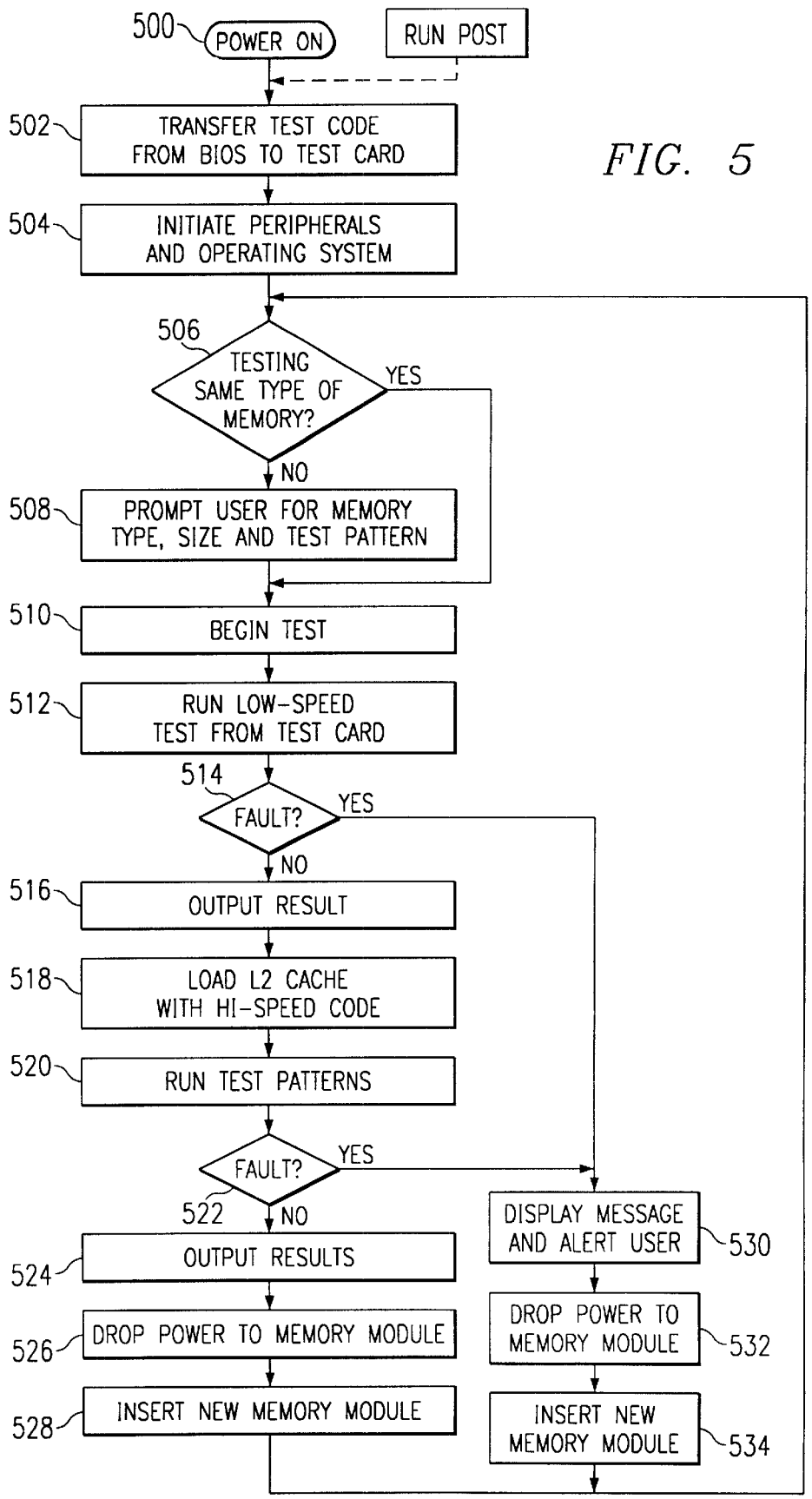
FIG. 5 illustrates a flowchart of the process for testing the physical memory.

Referring now to FIG. 5, there is illustrated a flowchart of the process for testing the physical memory. The process begins at a power-on stage 500 and moves to a function block 502 where the test code contained in system BIOS 104 is transferred to the test card memory 320 on the PCI test card 114 (the test card memory 320 is associated with those memory locations of the PCI address space 408). (As noted before, shortly after the power-on phase 500, the POST routine is run.) Flow moves from function block 502 to function block 504 where the initialization of peripherals occurs. Flow then moves to a decision block 506 to determine if the same type of physical memory 108 is being tested. The use of this check is discussed in greater detail hereinbelow. If not, flow moves out the "N" path of decision block 506 where the user is prompted via a user interface for the memory type, size, and the desired test pattern to be run on the particular type of memory, as indicated in function block 508. (Other parameters such as manufacturer may used to trigger use of selected test patterns, and can be input as needed in order to perform thorough testing of the physical memory 108.) A variety of test patterns are made available for testing a variety of different and proprietary memories. For example, a certain manufacturer may require that selected test patterns be used to ensure full-performance testing of its memory.

Flow then moves to a function block 510 where the test cycle begins. Flow then moves to a function block 512 where the first portion of the test is to run the low-speed test from the PCI test card 114. The low-speed test is not as intensive as the high-speed test, therefore if any failures appear during the low-speed test, the need to run the high-speed test is obviated, and the physical memory 108 may be removed and replaced with the next untested memory module. If a fault was not detected, flow moves out the "N" path of a decision block 514 to a function block 516 to output the results of the low-speed test. The output may be in the form of a display (LCD or LED) which outputs codes which provide interpretation of the test results. Flow then moves on to a function block 518 to load the cache memory 106 with the high-speed code from the system BIOS 104, portions of which now reside in memory locations associated with the run-time BIOS memory address space 434 of PCI address space 428.

Flow then moves to a function block 520 to run selected test patterns on the particular type of memory being tested. If no faults are detected, flow moves from a decision block 522 to a function block 524 to output the high-speed test pattern results. Flow then moves to a function block 526 to drop power to the physical memory 108 in preparation for replacement of a new untested memory module. Flow then moves to a function block 528 where a new memory module is inserted, and then loops back to the input of decision block 506 to confirm if the same type of memory is being tested or a different type of memory is being tested. For example, if a 32 MB DRAM module from manufacturer A was just tested, and the user now inserts a untested 64 MB module from manufacturer B, test parameters may need to be changed. If the same type of memory is being tested from the same-manufacturer, the user may not be required to enter any new test parameters. Flow moves out the "Y" path of decision block 506 to bypass the need to input any new memory information, and moves directly to the input of function block 510 to begin the test sequence.

Referring back to decision block 514, if a fault has been detected during the low speed examination of the memory, flow moves out the "Y" path to a function block 530 to display a message that a fault has occurred during the test and alert the user to the particular fault encountered. As mentioned hereinabove, the display mechanisms may include LCD or LED indicators which display a coded message indicating the particular type of fault encountered. (Note that audio alerts may also be used to alert the user to the particular type of fault encountered.) Flow then moves to a function block 532 where power is dropped to the physical memory 108. Flow moves to function block 532 where a new module is inserted for testing and flow loops back to the input of decision block.506 to determine if the same type of physical memory 108 is being tested. Referring back now to decision block 522, if a fault has been detected during the high-speed pattern tests, program flow moves out the "Y" path to the input of function block 530 to display messages and alert the user, as mentioned hereinabove for the low speed fault conditions.

Figure 6:
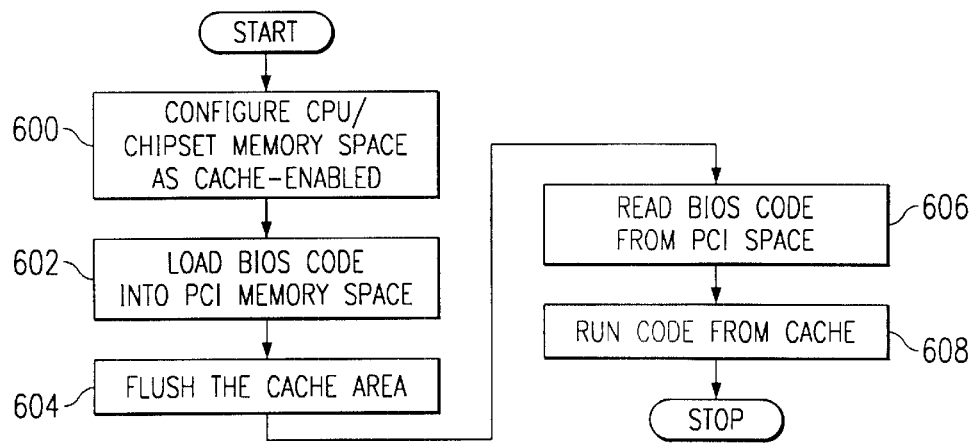
FIG. 6 illustrates a flowchart of the basic steps performed by the code in preparation for testing the physical memory.

Referring now to FIG. 6, there is illustrated a flowchart of the basic steps performed by the code in preparation for testing the physical memory 108. From a starting point, flow moves to a function block 600 where the CPU 102 and chipset address space (PCI address space 428) are configured as cache-enabled. Flow then. moves to function block 602 where the high-speed BIOS code is loaded into memory locations associated with the run-time BIOS address space 434 of PCI address space 428. Flow then moves to function block 604 where the cache memory 106 is flushed, and then on to a function block 606 where the BIOS code is read from the memory locations associated with the PCI address space 428 into the cache memory 106. At a function block 608, the high-speed code is run from the cache memory 106 to execute test patterns on the physical memory 108 under test.

Although the preferred embodiment has been described in detail, it should be understood that various changes, substitutions and alterations can be made therein without departing from the spirit and scope of the invention as defined by the appended claims.

What is claimed is:

1. A method of testing memory of a system, comprising the steps of:

operating the system from a second area of system address space which is outside of a first area of the system address space, the system having one or more physical memory devices associated with the first area of system address space;

testing the one or more physical memory devices associated with the first area of the system address space for predetermined characteristics, and replacing the one or more tested physical memory devices with respective untested physical memory devices without dropping power to the system, and repeating the step of testing to allow sequential testing of physical memory devices.

2. The method of claim 1, wherein the system runs a basic input/output system code in a slow memory for initiating startup of the system, the basic input/output system code having a high-speed section of memory test code which is loaded into a fast memory for execution, the fast memory providing substantially faster access than the slower memory.

3. The method of claim 2, wherein the fast memory is cache memory.

4. The method of claim 1, wherein the system runs a basic input/output system code in a slow memory for initiating startup of the system, the basic input/output system code having a low-speed section of memory test code which executes from the slow memory.

5. The method of claim 1, wherein the step of testing further comprises the steps of, comparing the predetermined characteristics with output characteristics to obtain a result, and alerting a user to the results of the test via a message.

6. The method of claim 1, wherein the first area is non-cache-enabled and the second area is cache-enabled.

7. The method of claim 1, wherein the first area is a physical memory space associated with the one or more physical memory devices and the second area is a peripheral memory space which is associated with a peripheral test card.

8. The method of claim 1, further comprising the step of dropping power to the one or more physical memory devices prior to the step of replacing.

9. The method of claim 8, wherein a test card switches power off to the one or more physical memory devices prior to the step of replacing.

10. The method of claim 1, wherein the step of replacing is accomplished while power is supplied to the one or more physical memory devices.

11. The method of claim 1, wherein the step of testing is performed with a memory mapping device, the memory mapping device defining a relationship between an address space and a memory location.

12. The method of claim 1, further comprising the step of electrically isolating a memory bus of the one or more physical memory devices from a peripheral bus, using a memory mapping device, such that removal of said one or more physical memory devices while the system is powered does not interrupt operation of the system.

13. The method of claim 1, and further comprising the step of removing power from only the memory module to be replaced prior to the step of replacing and reapplying power thereto after such step of replacing.

14. An architecture for testing memory of a system, comprising:

a first area of a system address space from which the system is operated, and which is outside of a second area of said system address space, the system having one or more physical memory devices associated with said first area of system address space, wherein said one or more physical memory devices associated with said first area of said system address space are tested for predetermined characteristics, and wherein said one or more physical memory devices which have been tested are replaced with respective said one or more physical memory devices which are untested, without dropping power to the system to allow sequential testing of physical memory devices.

15. The architecture of claim 14, wherein the system runs a basic input/output system code in a slow memory for initiating startup of the system, said basic input/output system code having a high-speed section of memory test code which is loaded into a fast memory for execution, said fast memory providing substantially faster access than said slower memory.

16. The architecture of claim 15, wherein said fast memory is cache memory.

17. The architecture of claim 14, wherein the system runs a basic input/output system code in a slow memory for initiating start-up of the system, said basic input/output system code having a low-speed section of memory test code which executes from said slow memory.

18. The architecture of claim 14, wherein said predetermined characteristics are compared with output characteristics to obtain a result, and a user is alerted to said results via a message.

19. The architecture of claim 14, wherein said first-area is non-cache-enabled and said second area is cache-enabled.

20. The architecture of claim 14, wherein said first area is a physical memory space associated with said one or more physical memory devices and said second area is a peripheral memory space which is associated with a peripheral test card.

21. The architecture of claim 14, wherein power is dropped to said one or more physical memory devices prior to said one or more physical memory devices being removed.

22. The architecture of claim 21, wherein a test card switches power off to said one or more physical memory devices prior to removing.

23. The architecture of claim 14, wherein power is supplied to said one or more physical memory devices which have been tested while said one or more physical memory devices are being removed.

24. The architecture of claim 14, wherein said one or more physical memory devices are tested using a memory mapping device, said memory mapping device defining a relationship between an address space and a memory space.

25. The architecture of claim 14, wherein a memory mapping device electrically isolates a memory bus of said one or more physical memory devices from a peripheral bus, such that removal of said one or more physical memory devices while the system is powered does not interrupt operation of the system.

26. The architecture of claim 14, wherein power is removed from said physical memory devices prior to removal and power reapplied thereto after replacement.

* * * * *